US011108130B1

(12) United States Patent
Wang et al.

(10) Patent No.: US 11,108,130 B1
(45) Date of Patent: Aug. 31, 2021

(54) ELECTRONIC DEVICE SLOT ANTENNAS (71) Applicant: Apple Inc., Cupertino, CA (US)

(72) Inventors: Paul X. Wang, Cupertino, CA (US); Bradley J. Hamel, San Carlos, CA (US); Jerzy S. Guterman, Sunnyvale, CA (US); Joel D. Barrera, San Jose, CA (US); Nicholas A. Rundle, San Jose, CA (US); Nikolaos Chiotellis, Campbell, CA (US); Simon S. Lee, San Jose, CA (US)

(73) Assignee: Apple Inc., Cupertino, CA (US)

( * ) Notice: Subject to any disclaimer, the term of this patent is extended or adjusted under 35 U.S.C. 154(b) by 11 days.

(21) Appl. No.: 16/800,920

(22) Filed: Feb. 25, 2020

(51) Int. Cl.
*H01Q 1/22* (2006.01)
*F16M 11/10* (2006.01)
*H05K 1/18* (2006.01)
*H05K 1/02* (2006.01)
*H01Q 13/10* (2006.01)

(52) U.S. Cl.
CPC ........... *H01Q 1/2266* (2013.01); *F16M 11/10* (2013.01); *H01Q 13/10* (2013.01); *H05K 1/0243* (2013.01); *H05K 1/189* (2013.01)

(58) Field of Classification Search
CPC ...... H01Q 1/2266; H01Q 13/10; H05K 1/189; H05K 1/0243; F16M 11/10; F16M 2200/00; F16M 2200/065; F16M 2200/08; F16L 3/1016

See application file for complete search history.

(56) References Cited

U.S. PATENT DOCUMENTS

| 9,024,883 | B2 | 5/2015 | Mia | |
| 9,917,347 | B2* | 3/2018 | Bologna | H01Q 1/2266 |
| 10,108,221 | B1 | 10/2018 | Gu et al. | |
| 10,215,371 | B1 | 2/2019 | Lehman et al. | |
| 10,278,300 | B2 | 4/2019 | Kim et al. | |
| 2003/0213099 | A1 | 11/2003 | Mori | |
| 2005/0002156 | A1 | 1/2005 | Hsu et al. | |
| 2014/0240177 | A1* | 8/2014 | Wang | H01Q 1/2266 343/702 |
| 2017/0329364 | A1* | 11/2017 | Kim | F16M 11/22 |
| 2019/0309894 | A1 | 10/2019 | Hasegawa et al. | |
| 2020/0303824 | A1* | 9/2020 | Barrera | H01Q 13/18 |

FOREIGN PATENT DOCUMENTS

WO    2019070253 A1    4/2019

\* cited by examiner

*Primary Examiner* — Daniel D Chang
(74) *Attorney, Agent, or Firm* — Treyz Law Group, P.C.; Michael H. Lyons (57) ABSTRACT

An electronic device such as a desktop computer may have a housing with a conductive housing wall and a display mounted to the housing opposite the conductive housing wall. A conductive tongue may extend through an opening in the housing wall to secure the housing to a hinge barrel on a desktop stand. A slot antenna may be formed from a slot element in the conductive tongue. The antenna may be fed by a flexible printed circuit coupled across the slot element or by a feed printed circuit in the housing that is coupled to the conductive tongue by a conductive screw. A conductive sleeve may be placed over the conductive tongue. The stand may be replaced with a mounting bracket.

20 Claims, 9 Drawing Sheets

ELECTRONIC DEVICE SLOT ANTENNAS

BACKGROUND

This relates to electronic devices, and more particularly, to electronic devices with wireless communications circuitry.

Electronic devices are often provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

It can be challenging to form a satisfactory antenna for an electronic device. For example, conductive housing structures for the electronic device can block or shield radio-frequency signals conveyed by the antenna. If care is not taken, the antenna may not perform satisfactorily, may be overly complex to manufacture, or may be difficult to integrate into a device.

SUMMARY

An electronic device such as a desktop computer may have a main body portion with a housing. The housing may have a conductive housing wall that forms a first face of the electronic device. A display may be mounted to the housing and may form a second face of the electronic device opposite the first face. The conductive housing wall may have an opening.

The electronic device may be mountable to a stand having a base portion, a neck portion, and a hinge barrel on the neck portion. The electronic device may include a conductive structure that secures the main housing portion to the hinge barrel of the stand. The conductive structure may include a support plate mounted to the conductive housing wall at an interior of the housing. The conductive structure may include a conductive tongue that extends from the support plate, that protrudes through the opening, and that has an end that is securable (mountable) to the hinge barrel of the stand. When the end of the conductive tongue is secured to the hinge barrel of the stand, the stand may hold the main body portion in place above an underlying surface such as a tabletop. The conductive tongue and the main body portion may be rotatable with respect to the stand about a hinge axis extending through the conductive tongue and the hinge barrel.

Antennas for the electronic device may be formed in the conductive tongue of the conductive structure. The antennas may include a single closed slot antenna or a pair of open slot antennas. The antenna(s) may have a radiating slot element cut into the conductive tongue. The slot element may be fed by feed printed circuit mounted in the housing. A conductive screw may couple signal traces on the feed printed circuit to the conductive tongue at a side of the slot element opposite the conductive housing wall. In another suitable arrangement, the slot element may be fed by a flexible printed circuit that is received by a notch in the conductive tongue. The flexible printed circuit may bridge the slot element. Signal and ground traces on the flexible printed circuit may be coupled to the conductive tongue at opposing sides of the slot element. A conductive sleeve may surround the conductive tongue to hide the antenna and to protect the antenna from damage. A dielectric liner may be interposed between the flexible printed circuit and the conductive sleeve.

If desired, a mounting bracket may be attached to the conductive housing wall. The mounting bracket may be separated from the conductive housing wall by a cavity. The conductive tongue may protrude into the cavity. The antenna in the conductive tongue may radiate out of the cavity. The mounting bracket may be a flat display mounting interface (FDMI) compliant mounting bracket, for example.

DETAILED DESCRIPTION

Figure 1:
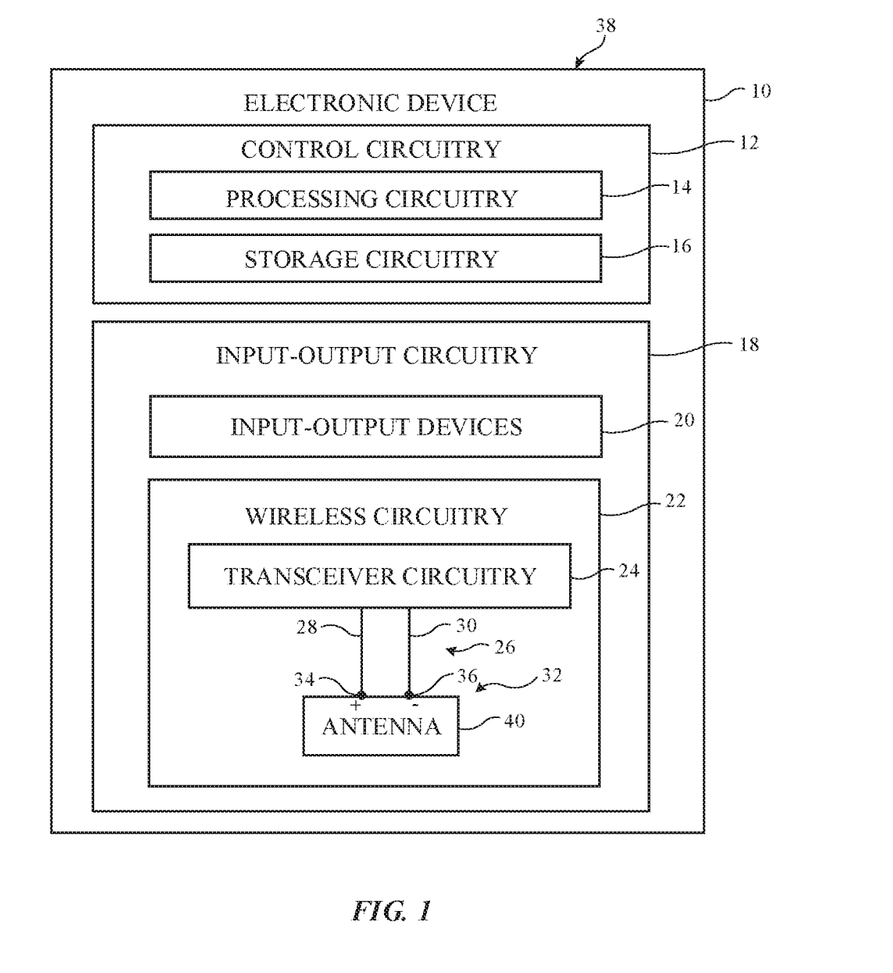
FIG. 1 is a schematic diagram of an illustrative electronic device in accordance with some embodiments.

An electronic device such as electronic device 10 of FIG. 1 may be provided with wireless circuitry. The wireless circuitry may include antennas such as wireless local area network antennas or other antennas. Electronic device 10 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a wireless base station or access point, equipment that implements the functionality of two or more of these devices, or other electronic equipment. An arrangement in which device 10 is a desktop computer having a computer display (monitor) embedded therein is described herein as an example.

As shown in FIG. 1, device 10 may include control circuitry 12. Control circuitry 12 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc.

Control circuitry 12 may include processing circuitry such as processing circuitry 14. Processing circuitry 14 may be used to control the operation of device 10. Processing circuitry 14 may include on one or more microprocessors, microcontrollers, digital signal processors, host processors, baseband processor integrated circuits, application specific integrated circuits, central processing units (CPUs), etc. Control circuitry 12 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 14.

Control circuitry 12 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 12 may be used in implementing communications protocols. Communications protocols that may be implemented using control circuitry 12 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols, cellular telephone protocols, MIMO protocols, antenna diversity protocols, satellite navigation system protocols (e.g., global positioning system (GPS) protocols, global navigation satellite system (GLONASS) protocols, etc.), or any other desired communications protocols. Each communications protocol may be associated with a corresponding radio access technology (RAT) that specifies the physical connection methodology used in implementing the protocol.

Device 10 may include input-output circuitry 18. Input-output circuitry 18 may include input-output devices 20. Input-output devices 20 may be used to allow data to be supplied to device 10 and to allow data to be provided from device 10 to external devices. Input-output devices 20 may include user interface devices, data port devices, and other input-output components. For example, input-output devices 20 may include touch sensors, displays, light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 20 may be peripherals that are coupled to a main processing unit or other portion of device 10 via a wired or wireless link).

Input-output circuitry 18 may include wireless circuitry 22 to support wireless communications. Wireless circuitry 22 may include radio-frequency (RF) transceiver circuitry 24 formed from one or more integrated circuits, power amplifier circuitry, low-noise input amplifiers, passive RF components, one or more antennas such as antenna 40, transmission lines such as transmission line 26, and other circuitry for handling RF wireless signals. Wireless signals can also be sent using light (e.g., using infrared communications). While control circuitry 12 is shown separately from wireless circuitry 22 in the example of FIG. 1 for the sake of clarity, wireless circuitry 22 may include processing circuitry that forms a part of processing circuitry 14 and/or storage circuitry that forms a part of storage circuitry 16 of control circuitry 12 (e.g., portions of control circuitry 12 may be implemented on wireless circuitry 22). As an example, control circuitry 12 (e.g., processing circuitry 14) may include baseband processor circuitry or other control components that form a part of wireless circuitry 22.

Radio-frequency transceiver circuitry 24 may include wireless local area network transceiver circuitry that handles 2.4 GHz and 5 GHz bands for Wi-Fi® (IEEE 802.11) or other WLAN communications bands and may include wireless personal area network transceiver circuitry that handles the 2.4 GHz Bluetooth® communications band or other WPAN communications bands. If desired, radio-frequency transceiver circuitry 24 may handle other bands such as cellular telephone bands, near-field communications bands (e.g., at 13.56 MHz), millimeter or centimeter wave bands (e.g., communications at 10-300 GHz), and/or other communications bands. Configurations in which radio-frequency transceiver circuitry 24 handles wireless local area network bands (e.g., at 2.4 GHz and 5 GHz) may sometimes be described herein as an example. In general, however, radio-frequency transceiver circuitry 24 may be configured to cover any suitable communications bands of interest.

Wireless circuitry 22 may include one or more antennas such as antenna 40. Antennas such as antenna 40 may be formed using any suitable antenna types. For example, antennas in device 10 may include antennas with resonating elements that are formed from loop antenna structures, patch antenna structures, inverted-F antenna structures, slot antenna structures, planar inverted-F antenna structures, helical antenna structures, monopole antennas, dipoles, hybrids of these designs, etc. Parasitic elements may be included in antennas 40 to adjust antenna performance. Antenna 40 may be provided with a conductive cavity that backs the antenna resonating element of antenna 40 (e.g., antenna 40 may be a cavity-backed antenna such as a cavity-backed slot antenna). In some configurations, device 10 may have isolation elements between respective antennas 40 to help avoid antenna-to-antenna cross-talk. Different types of antennas may be used for different bands and combinations of bands. For example, one type of antenna may be used in forming a local wireless link antenna and another type of antenna may be used in forming a remote wireless link antenna. In some configurations, different antennas may be used in handling different bands for radio-frequency transceiver circuitry 24. Each antenna 40 may cover one or more bands. For example, antennas 40 may be single band wireless local area network antennas or dual band wireless local area network antennas.

As shown in FIG. 1, radio-frequency transceiver circuitry 24 may be coupled to antenna feed 32 of antenna 40 using transmission line path 26. Antenna feed 32 may include a positive antenna feed terminal such as positive antenna feed terminal 34 and may include a ground antenna feed terminal such as ground antenna feed terminal 36. Transmission line path 26 may be formed from metal traces on a printed circuit, cables, or other conductive structures. Transmission line path 26 may have a positive transmission line signal path such as path 28 that is coupled to positive antenna feed terminal 34. Transmission line path 26 may have a ground transmission line signal path such as path 30 that is coupled to ground antenna feed terminal 36. Path 28 may sometimes be referred to herein as signal conductor 28 and path 30 may sometimes be referred to herein as ground conductor 30.

Transmission line path 26 may include transmission lines that are used to route antenna signals within device 10. Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in transmission line path 26 may be integrated into rigid and/or flexible printed circuit boards. In one suitable arrangement, transmission line paths such as transmission line path 26 may also include transmission line conductors (e.g., signal conductors 28 and ground conductors 30) integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Filter circuitry, switching circuitry, impedance matching circuitry, and other circuitry may be interposed within the paths formed using transmission line path 26 and/or circuits such as these may be incorporated into antenna 40 (e.g., to support antenna tuning, to support operation in desired frequency bands, etc.). During operation, control circuitry 12 may use radio-frequency transceiver circuitry 24 and antenna(s) 40 to transmit and receive data wirelessly. Control circuitry 12 may, for example, receive wireless local area network communications wirelessly using radio-frequency transceiver circuitry 24 and antenna(s) 40 and may transmit wireless local area network communications wirelessly using radio-frequency transceiver circuitry 24 and antenna(s) 40.

Electronic device 10 may be provided with electronic device housing 38. Housing 38, which may sometimes be referred to as a case, may be formed of plastic, glass, ceramics, fiber composites, metal (e.g., stainless steel, aluminum, etc.), other suitable materials, or a combination of these materials. Housing 38 may be formed using a unibody configuration in which some or all of housing 38 is machined or molded as a single structure or may be formed using multiple structures (e.g., an internal frame structure covered with one or more outer housing layers). Configurations for housing 38 in which housing 38 includes support structures (a stand, leg(s), handles, etc.) may also be used.

Figure 2:
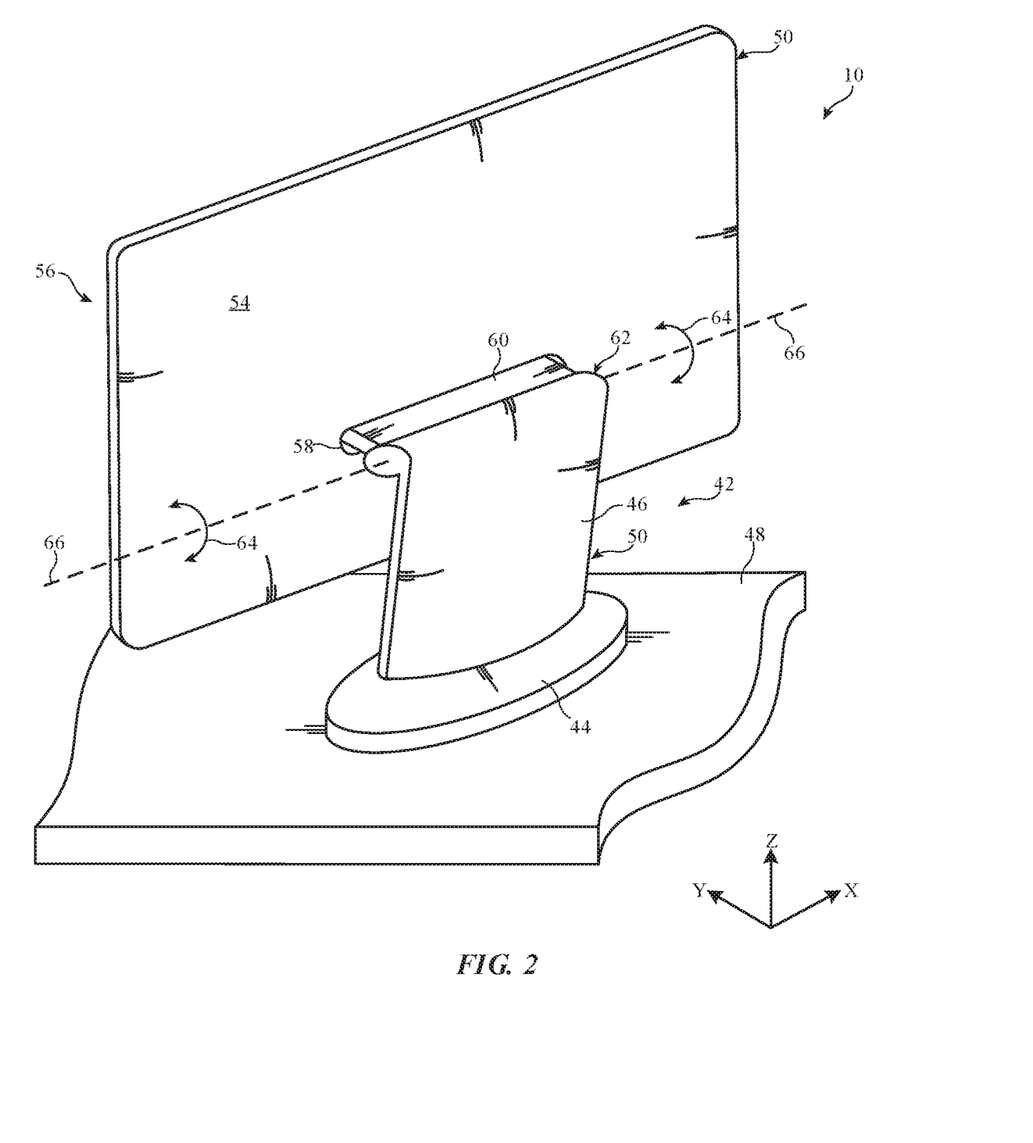
FIG. 2 is a rear perspective view of an illustrative electronic device in accordance with some embodiments.

A rear perspective view of an illustrative electronic device such as device 10 of FIG. 1 is shown in FIG. 2. As shown in FIG. 2, device 10 may include a main body portion such as main body portion 52. Main body portion 52 may have a front face 56 that forms a display for device 10 (e.g., a pixel array that is covered by a display cover layer). All or substantially all of front face 56 may be covered by the display (e.g., by the display cover layer and/or by the pixel array used to produce images for the display). Front face 56 may therefore sometimes be referred to herein as display 56. If desired, some of front face 56 may be covered by metal housing walls and/or dielectric housing walls (e.g., housing walls that form part of housing 38 of FIG. 1).

Main body portion 52 may have a rear wall 54 that opposes front face 56 (e.g., rear wall 54 may form a part of housing 38 of FIG. 1). Rear wall 54 may be planar, substantially planar, or curved. Front face 56 may be planar, substantially planar, or curved. Rear wall 54 may be formed from conducive material, dielectric, or a combination of conductive and dielectric materials. In one suitable arrangement that is described herein as an example, rear wall 54 is formed from metal without any dielectric portions (e.g., without a dielectric logo or other dielectric windows). Rear wall 54 may therefore sometimes be referred to herein as conductive rear wall 54 or conductive housing wall 54. However, conductive rear wall 54 may include an opening such as opening 58. Opening 58 may, for example, accommodate additional structures that allow for device 10 (e.g., main body portion 52) to be mounted to a table-top stand or to a wall-mount. Other openings may be formed in main body portion 52 to accommodate buttons, speakers, data ports, accessory ports, and/or other input/output components.

As shown in FIG. 2, main body portion 52 of device 10 may be mounted to a stand such as stand 42. Stand 42 may be placed on a surface such as surface 48 (e.g., a tabletop, desktop, the floor, or other surfaces). Stand 42 may have a base portion 44 that rests on surface 48 and may have a neck portion 46 that extends vertically from base portion 44. Neck portion 46 may include an attachment structure such as hinge barrel 62. Stand 42 may include a housing such as stand housing 50. Stand housing 50 may be formed from metal and/or dielectric material. In one suitable arrangement, stand housing 50 is formed from the same metal material used to form conductive rear wall 54 of main body portion 52. Stand housing 50 may have openings (e.g., in neck portion 46) that allow power cords or other cables to pass from main body portion 52 to the rear side of stand 42.

Main body portion 52 may include a conductive structure such as conductive structure 60. Conductive structure 60 may protrude through opening 58 towards hinge barrel 62 of stand 42. The end of conductive structure 60 may be inserted into and attached (secured) to hinge barrel 62. In one suitable arrangement that is described herein as an example, conductive structure 60 may include a conductive support plate within the interior of main body portion 52 and may include a conductive tongue that extends from the conductive support plate and protrudes through opening 58 to hinge barrel 62.

Hinge barrel 62 may include hinges, fasteners, or any other desired structures for receiving and securing conductive structure 60. Once attached to hinge barrel 62, conductive structure 60 and thus main body portion 52 may be rotated about hinge axis 66 (e.g., an axis extending longitudinally through hinge barrel 62, parallel to the X-axis of FIG. 2) while stand 42 remains stationary in place, as shown by arrows 64. This may allow a user of device 10 to adjust the position and/or orientation of main body portion 52 relative to stand 42 to provide the user with a satisfactory viewing angle for the display on front face 56, for example.

Hinge barrel 62 may allow main body portion 52 to remain at a desired orientation (e.g., after rotation about hinge axis 66) until the user re-orients main body portion 52. Control circuitry 12, input-output devices 20, and transceiver circuitry 24 of FIG. 1 may be located (housed) within main body portion 52 (e.g., between front face 56 and conductive rear wall 54).

Forming conductive rear wall 54 entirely from metal may provide device 10 with an attractive all-metal appearance while also maximizing the structural integrity of main body portion 52. However, if care is not taken, forming conductive rear wall 54 entirely from metal may block antennas 40 (FIG. 1) within main body portion 52 from being able to radiate with satisfactory antenna efficiency in all directions around device 10 (e.g., particularly towards the rear side of device 10). In order to allow for satisfactory antenna efficiency around all sides of device 10, one or more antennas 40 may be formed from conductive structure 60. In general, the antennas 40 in conductive structure 60 may be formed using any desired antenna architectures. In one suitable arrangement that is described herein as an example, antenna 40 may be a slot antenna formed in conductive structure 60.

Figure 3:
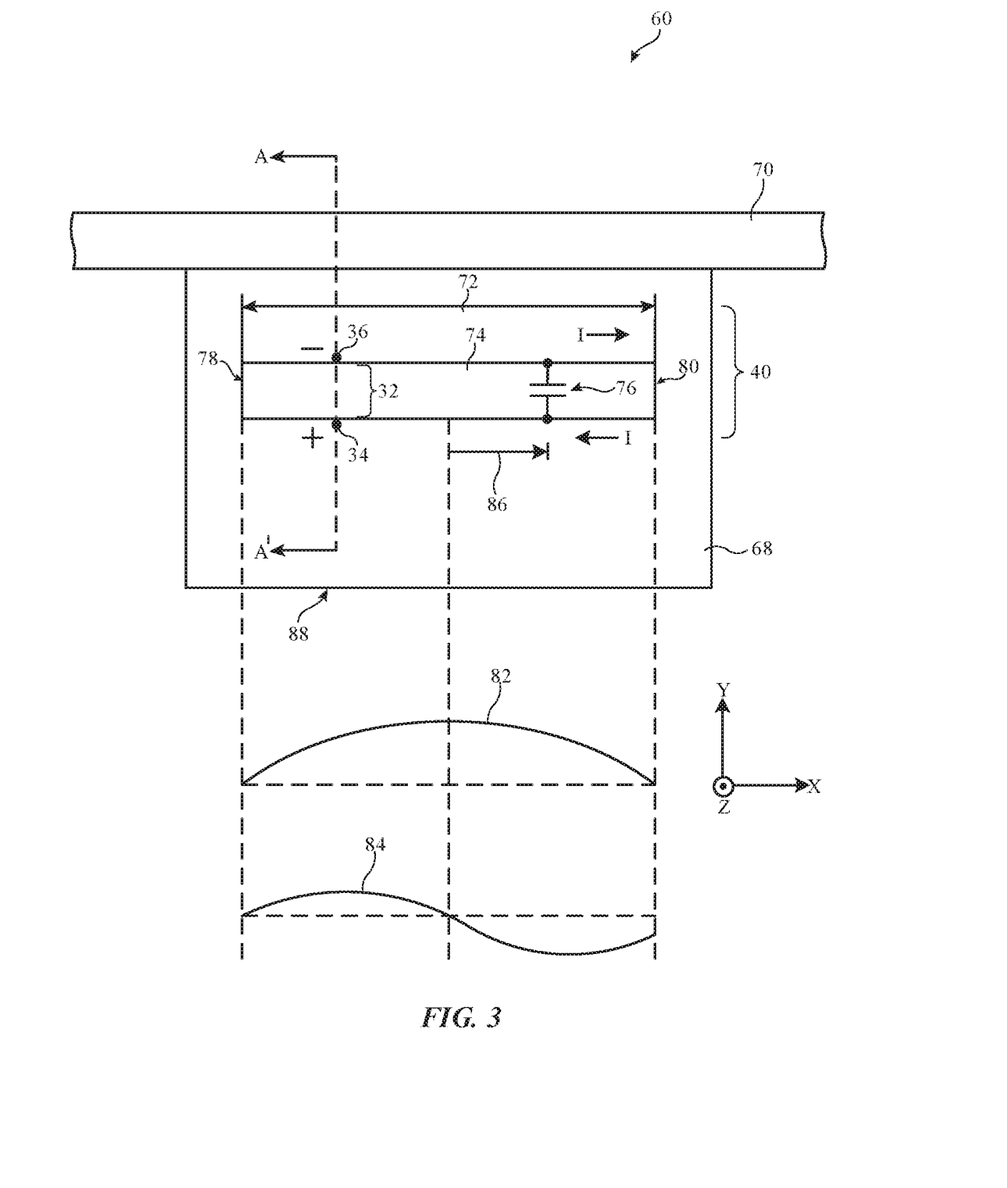
FIG. 3 is a top-down view of an illustrative closed slot antenna in accordance with some embodiments.

An illustrative slot antenna formed in conductive structure 60 is shown in FIG. 3. As shown in FIG. 3, conductive structure 60 may include a conductive support plate such as support plate 70 and a conductive tongue such as conductive tongue 68. Support plate 70 and conductive tongue 68 may be formed from integral portions of the same piece of conductive material (e.g., machined metal) or may be formed from separate conductors that are joined together (e.g., using welds, solder, conductive adhesive, adhesive tape, screws, brackets, clips, etc.). Support plate 70 may be placed against the interior surface of conductive rear wall 54 in main body portion 52 of device 10 (FIG. 2). Conductive tongue 68 may extend from conductive support plate 70 and may protrude through opening 58 towards stand 42 (FIG. 2). The end 88 of conductive tongue 68 opposite support plate 70 may be attached or otherwise secured within hinge barrel 62 of stand 42 (FIG. 2).

As shown in FIG. 3, conductive tongue 68 may be provided with a dielectric-filled slot element as slot element 74. Slot element 74 may extend through an entirety of the thickness of conductive tongue 68 (e.g., parallel to the Z-axis of FIG. 3). Slot element 74 may serve as the antenna resonating element for antenna 40 and may sometimes be referred to herein as slot 74, slot radiating element 74, radiating element 74, resonating element 74, slot resonating element 74, or slot antenna resonating element 74.

Antenna 40 may be fed using antenna feed 32 coupled across slot element 74. In particular, positive antenna feed terminal 34 and ground antenna feed terminal 36 of antenna feed 32 may be coupled to opposing sides of slot element 74 along the length 72 of slot element 74. Radio-frequency antenna current I may flow between antenna feed terminals 34 and 36 around the perimeter of slot element 74. Corresponding radio-frequency signals may be radiated by slot element 74. Similarly, radio-frequency signals received by antenna 40 may produce radio-frequency antenna currents around slot element 74 that are received by antenna feed 32. Slot element 74 may have a width perpendicular to length 72. The width may be less than length 72.

Antenna feed 32 may be coupled across slot element 74 at a distance from the left or right edge (side) of slot element 74 that is selected to match the impedance of antenna 40 to the impedance of the corresponding transmission line. For example, antenna current I flowing around slot element 74 may experience an impedance of zero at left edge 78 and right edge 80 of slot element 74 (e.g., a short circuit impedance) and an infinite (open circuit) impedance at the center of slot element 74 (e.g., at a fundamental frequency of the slot). Antenna feed 32 may be located between the center of slot element 74 and one of the left or right edges at a location where the antenna current experiences an impedance that matches the impedance of the corresponding transmission line (e.g., 50 Ohms).

The perimeter of slot element 74 may be selected to configure slot element 74 to radiate radio-frequency signals within desired frequency bands. For example, when length 72 is significantly greater than the width of slot element 74 (e.g., when slot element 74 is long and narrow), length 72 may be approximately equal to (e.g., within 15% of) one-half of an effective wavelength of operation of antenna 40. The effective wavelength of operation may be equal to the free space wavelength of the radio-frequency signals conveyed by antenna 40 multiplied by a constant factor that is determined based on the dielectric constant of the material within slot element 74. Harmonic modes of slot element 74 may also be configured to cover additional frequency bands (e.g., so that antenna 40 operates as a multi-band antenna).

For example, slot element 74 may be characterized by multiple electromagnetic standing wave modes that are associated with different response peaks for antenna 40. These discrete modes may be determined by the dimensions of slot element 74 (e.g., length 72). For example, the dimensions of slot element 74 may define the boundary conditions for electromagnetic standing waves in each of the standing wave modes that are excited on slot element 74 by antenna currents I conveyed over positive antenna feed terminal 34 and ground antenna feed terminal 36 and/or by received radio-frequency signals. Such standing wave modes of slot element 74 include a fundamental mode and one or more harmonics of the fundamental mode (i.e., so-called harmonic modes of slot element 74). Slot element 74 may exhibit antenna response peaks at frequencies associated with the fundamental mode and one or more of the harmonic modes of slot element 74 (e.g., where the harmonic modes are typically at multiples of the fundamental modes).

Curves 82 and 84 are shown on FIG. 3 to illustrate some of the standing wave modes of slot element 74. As shown in FIG. 3, curves 82 and 84 plot the voltage across slot element 74 (perpendicular to length 72) at different points along length 72. Similarly, curves 82 and 84 may also represent the magnitude of the electric field within slot element 74 at different points along length 72 (e.g., where the electric field extends in a direction perpendicular to length 72). In each mode, nodes in the voltage distribution are present at edges 78 and 80 (e.g., length 72 establishes boundary conditions for the electromagnetic standing waves produced on slot element 74 in the different modes).

Curve 82 represents the voltage distribution across slot element 74 in the fundamental mode. As shown in FIG. 3, in the fundamental mode associated with curve 82, the voltage across slot element 74 (e.g., in a direction parallel to edges 78 and 80) and the magnitude of the electric field reaches a maximum (e.g., an anti-node) at the center of slot element 74 (e.g., half way across length 72). Length 72 may establish the fundamental mode, where length 72 is approximately one-half of the corresponding wavelength of operation for the fundamental mode. The wavelength of operation may, for example, be an effective wavelength of operation based on the dielectric material within slot element 74.

Curve 84 represents the voltage distribution across slot element 74 in a first harmonic mode. As shown in FIG. 3, in the first harmonic mode associated with curve 84, the voltage across slot element 74 and the magnitude of electric field reach maxima (anti-nodes) at one-quarter and three-quarters of length 72 from edge 78. At the same time, in the first harmonic mode the voltage across slot element 74 and the magnitude of the electric field are at a node (e.g., a minimum or zero-value) at the center of slot element 74. Antenna 40 may exhibit a response peak associated with the first harmonic mode at a frequency that is approximately twice the frequency associated with the fundamental mode, for example.

The modes associated with curves 82 and 84 may support coverage in corresponding frequency bands for antenna 40. In one suitable arrangement, the fundamental mode associated with curve 82 may configure slot element 74 to cover the first frequency band (e.g., a 2.4 GHz WLAN band such as a band that includes 2.45 GHz). Similarly, the harmonic mode associated with curve 84 may configure slot element 74 to cover the second frequency band (e.g., a 5 GHz WLAN band such as a band that includes 5.5 GHz).

Antenna tuning components may be coupled to antenna 40. As an example, one or more antenna tuning components such as capacitor 76 may bridge slot element 74. Capacitor 76 may be, for example, a fixed capacitor having a fixed capacitance. Capacitor 76 may be configured to tune the frequency band of the radio-frequency signals conveyed by antenna 40. Capacitor 76 may be located at distance 86 from the center of slot 74. Distance 86 may be selected so that capacitor 76 adjusts the frequency response of antenna 40 for both the fundamental mode (e.g., at 2.4 GHz) and the first harmonic mode (e.g., at 5 GHz). Greater distances 86 may decrease the impact of capacitor 76 on the fundamental mode while increasing the impact of capacitor 76 on the first harmonic mode, whereas shorter distances 86 may increase the impact of capacitor 76 on the fundamental mode while decreasing the impact of capacitor 76 on the first harmonic mode (e.g., because the first harmonic mode exhibits a node at the center of slot element 74). Slot element 74 may be filled with dielectric material if desired. The example of FIG. 3 is merely illustrative. In general, any desired number of any desired type of antenna tuning components may be coupled across slot element 74 at any desired locations. The locations of positive antenna feed terminal 34 and ground antenna feed terminal 36 in FIG. 3 may be swapped if desired.

Figure 4:
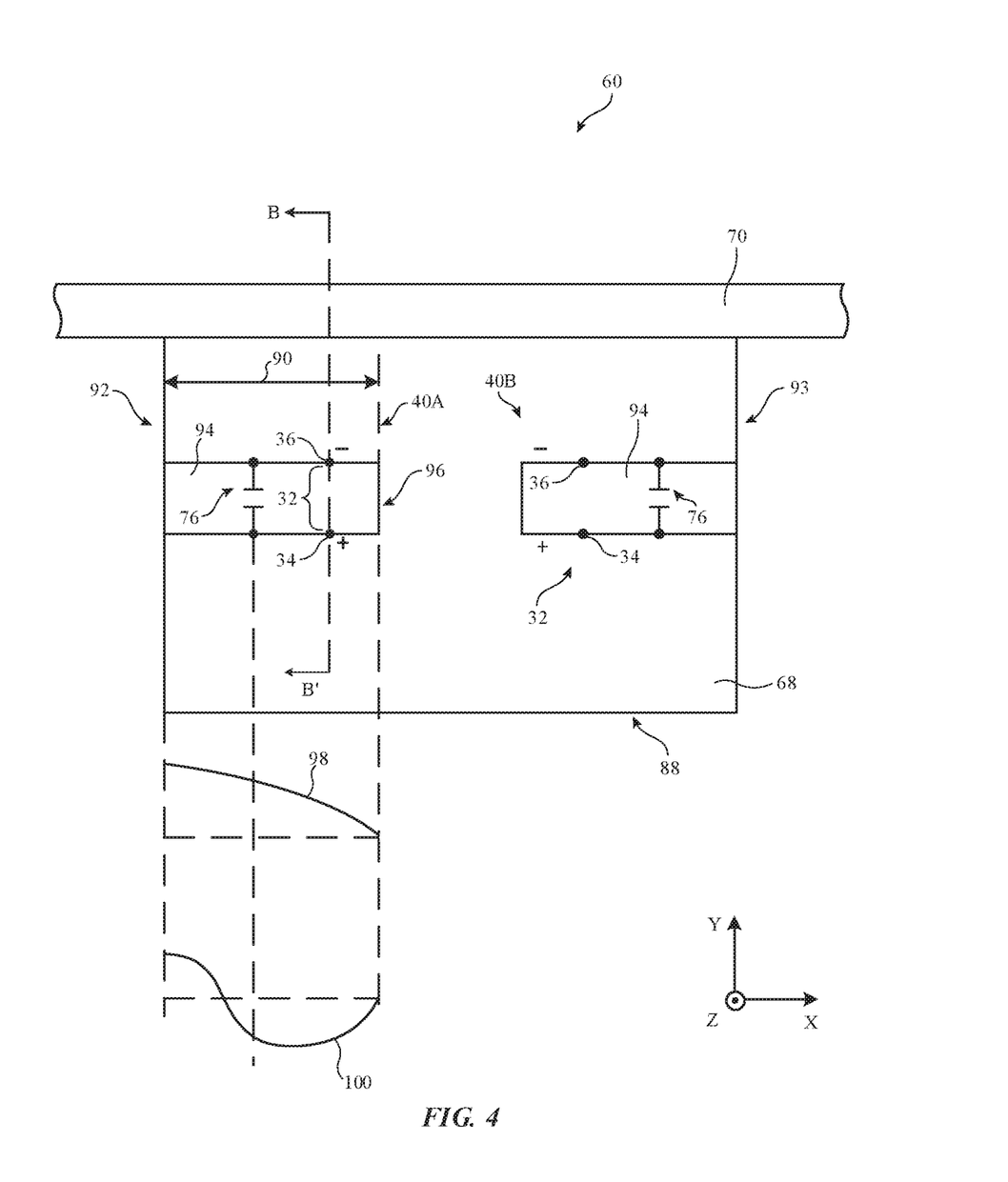
FIG. 4 is a top-down view of illustrative open slot antennas in accordance with some embodiments.

In the example of FIG. 3, slot element 74 is a closed slot because conductive tongue 68 completely surrounds and encloses slot element 74. In another suitable arrangement, antenna 40 may include an open slot element, as illustrated in FIG. 4. As shown in FIG. 4, in scenarios where antenna 40 includes an open slot element, conductive tongue 68 may include multiple antennas 40 such as a first antenna 40A located at left edge 92 of conductive tongue 68 and a second antenna 40B located at right edge 93 of conductive tongue 68.

Antenna 40A includes an open slot element 94 (as opposed to the closed slot element 74 of FIG. 3). Slot element 94 has a closed edge 96 defined by conductive tongue 68 and an opposing open end defined by left edge 92. Antenna 40B may include the same structures and operate in the same way as antenna 40A (e.g., where open slot element 94 of antenna 40B has an open end defined by right edge 93 of conductive tongue 68), albeit with mirror symmetry about the Y-axis. Slot elements 94 may extend through an entirety of the thickness of conductive tongue 68 (e.g., parallel to the Z-axis of FIG. 4). Slot elements 94 may serve as the antenna resonating elements for antennas 40A and 40B and may sometimes be referred to herein as slots 94, slot radiating elements 94, radiating elements 94, resonating elements 94, slot resonating elements 94, or slot antenna resonating elements 94. By forming both antennas 40A and 40B in conductive tongue 68, antennas 40A and 40B may collectively provide satisfactory radio-frequency coverage in both the +X and −X directions, despite the antennas including open slot elements 94. The operation of antenna 40A is described herein by example.

Antenna feed 32 may be coupled across slot element 94. In particular, positive antenna feed terminal 34 and ground antenna feed terminal 36 of antenna feed 32 may be coupled to opposing sides of slot element 94 along the length 90 of slot element 94. Radio-frequency antenna current may flow between antenna feed terminals 34 and 36 around the perimeter of slot element 94. Corresponding radio-frequency signals may be radiated by slot element 94. Similarly, radio-frequency signals received by antenna 40A may produce radio-frequency antenna currents around slot element 94 that are received by antenna feed 32. Slot element 94 may have a width perpendicular to length 90. The width may be less than length 90.

Antenna feed 32 may be coupled across slot element 94 at a distance from the right edge (side) of slot element 94 that is selected to match the impedance of antenna 40A to the impedance of the corresponding transmission line. The perimeter of slot element 94 may be selected to configure slot element 94 to radiate radio-frequency signals within desired frequency bands. For example, when length 90 is significantly greater than the width of slot element 94 (e.g., when slot element 94 is long and narrow), length 90 may be approximately equal to (e.g., within 15% of) one-quarter of an effective wavelength of operation of antenna 40A. The effective wavelength of operation may be equal to the free space wavelength of the radio-frequency signals conveyed by antenna 40A multiplied by a constant factor that is determined based on the dielectric constant of the material within slot element 94. Harmonic modes of slot element 94 may also be configured to cover additional frequency bands (e.g., so that antenna 40A operates as a multi-band antenna).

For example, slot element 94 may be characterized by multiple electromagnetic standing wave modes that are associated with different response peaks for antenna 40. Curves 98 and 100 are shown on FIG. 4 to illustrate some of the standing wave modes of slot element 94. As shown in FIG. 4, curves 98 and 100 plot the voltage across slot element 94 (perpendicular to length 90) at different points along length 90. Similarly, curves 98 and 100 may also represent the magnitude of the electric field within slot element 94 at different points along length 90 (e.g., where the electric field extends in a direction perpendicular to length 90). In each mode, nodes in the voltage distribution are present at edge 96 (e.g., length 90 establishes boundary conditions for the electromagnetic standing waves produced on slot element 94 in the different modes).

Curve 98 represents the voltage distribution across slot element 94 in a first electromagnetic mode (e.g., a fundamental $\lambda/4$ mode). As shown in FIG. 4, in the first electromagnetic mode associated with curve 98, the voltage across slot element 94 (e.g., in a direction parallel to edge 96) and the magnitude of the electric field reaches a maximum (e.g., an anti-node) at the open end of slot element 94. Length 90 may establish the first electromagnetic mode, where length 90 is approximately one-quarter of the corresponding wavelength of operation for the first electromagnetic mode. The wavelength of operation may, for example, be an effective wavelength of operation based on the dielectric material within slot element 94.

Curve 100 represents the voltage distribution across slot element 94 in a second electromagnetic mode (e.g., a harmonic 3λ/4 mode that is a second order harmonic of the first electromagnetic λ/4 mode). As shown in FIG. 4, in the second electromagnetic mode associated with curve 100, the voltage across slot element 94 and the magnitude of electric field reach maxima (anti-nodes) at edge 92 and between the location of capacitor 76 and edge 96. At the same time, in the second electromagnetic mode the voltage across slot element 94 and the magnitude of the electric field are at a node (e.g., a minimum or zero-value) between edge 92 and the location of capacitor 76. The modes associated with curves 98 and 100 may support coverage in corresponding frequency bands for antenna 40A. In one suitable arrangement, the first electromagnetic mode associated with curve 98 may configure slot element 94 to cover the first frequency band (e.g., a 2.4 GHz WLAN band such as a band that includes 2.45 GHz). Similarly, the second electromagnetic mode associated with curve 100 may configure slot element 94 to cover the second frequency band (e.g., a 5 GHz WLAN band such as a band that includes 5.5 GHz). Capacitor 76 may be located at a distance from edge 92 that is selected so that capacitor 76 adjusts the frequency response of antenna 40A for both the first electromagnetic mode (e.g., at 2.4 GHz) and the second electromagnetic mode (e.g., at 5 GHz).

Figure 5:
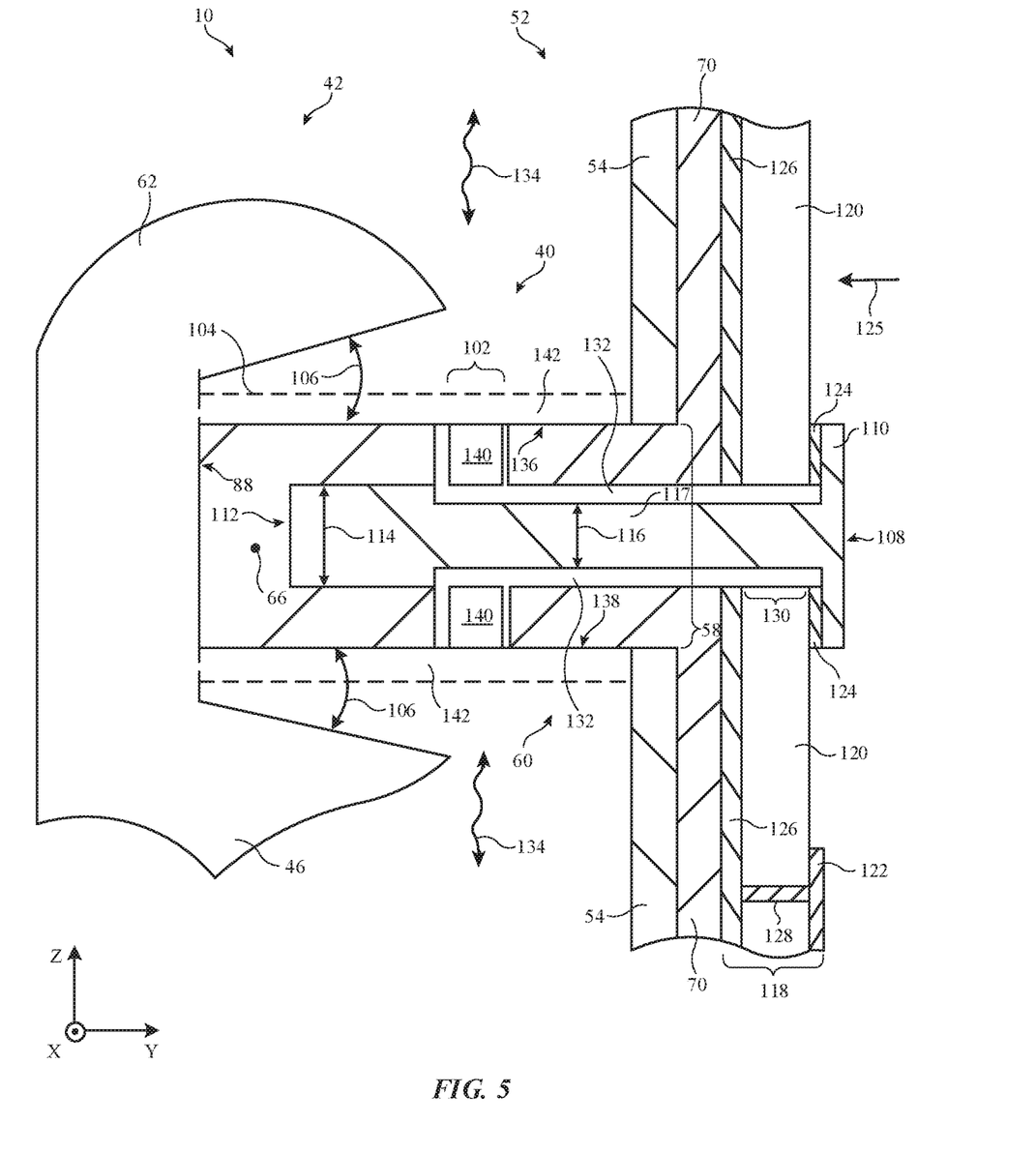
FIG. 5 is a cross-sectional side view showing how a slot antenna may be formed in a conductive structure that couples an electronic device housing to a stand in accordance with some embodiments.

FIG. 5 is a cross sectional side view of device 10 showing how a slot antenna may be integrated into conductive structure 60 (e.g., as taken in the direction of line AA' of FIG. 3 or line BB' of FIG. 4). As shown in FIG. 5, hinge barrel 62 on neck portion 46 of stand 42 may include an opening or cavity such as cavity 104. End 88 of conductive tongue 68 on conductive structure 60 may be inserted into cavity 104. Conductive tongue 68 may be secured to hinge barrel 62 (e.g., using hinges or other structures) such that conductive structure 60 and thus main body portion 52 can rotate about hinge axis 66, as shown by arrows 106. Hinge axis 66 may run through conductive tongue 68 or elsewhere within hinge barrel 62. Cavity 104 may include sufficient room above and/or below conductive tongue 68 to allow conductive structure 60 to rotate upwards and/or downwards.

Support plate 70 of conductive structure 60 may be located within main body portion 52 of device 10. Support plate 70 may, for example, be mounted to (e.g., in direct contact with) the interior surface of conductive rear wall 54 of main body portion 52. If desired, support plate 70 may be secured to conductive rear wall 54 using adhesive, solder, welds, screws, biasing structures, springs, pins, brackets, and/or any other desired fastening structures. Support plate 70 may, if desired, be conductively coupled (e.g., shorted) to conductive rear wall 54 (e.g., using solder, welds, conductive screws, conductive adhesive, etc.). Support plate may help to provide structural support to conductive rear wall 54 so conductive rear wall 54 is not excessively stressed (strained) due to the weight of main body portion 52 when mounted to stand 42. As an example, conductive rear wall 54 may be formed from a relatively lightweight material such as anodized aluminum, whereas support plate 70 may be formed from a stronger material such as stainless steel.

Conductive tongue 68 of conductive structure 60 may extend from support plate 70 towards hinge barrel 62. Conductive tongue 68 may protrude through opening 58 in conductive rear wall 54. Conductive tongue 68 may include slot element 102. Slot element 102 may extend all the way through the thickness of conductive tongue 68 if desired (e.g., from upper surface 136 to lower surface 138 of conductive tongue 68). Conductive tongue 68 may be formed from the same material as support plate 70 (e.g., stainless steel) or may be formed from other metals or conductive materials.

Slot element 102 may form the antenna radiating element for antenna 40 in conductive structure 60. Slot element 102 may be a closed slot element (e.g., slot element 74 of FIG. 3) or an open slot element (e.g., slot element 94 of FIG. 4). In scenarios where slot element 102 is an open slot element, conductive structure 60 may include two slot elements 102 for forming antennas 40A and 40B of FIG. 4. If desired, dielectric material such as dielectric 140 may be inserted into slot 102. Dielectric 140 may include plastic, glass, foam, or other dielectrics. Optional cosmetic cover layers such as dielectric cover layers 142 may be layered over upper surface 136 and/or under lower surface 138. Dielectric cover layers 142 may, for example, help hide slot element 102 from view and protect antenna 40 from contaminants or damage.

Antenna 40 of FIG. 5 may be fed using feed structures such as printed circuit 118 (sometimes referred to herein as feed printed circuit 118). Feed printed circuit 118 may, for example, be a flexible printed circuit or a rigid printed circuit board. Feed printed circuit 118 may include one or more dielectric layers 120 that are patterned with conductive traces. As shown in FIG. 5, ground traces such as ground traces 126 and 122 may be patterned on dielectric layers 120. The ground traces patterned on different layers/surfaces of feed printed circuit 118 may be shorted together using one or more conductive vias 128. Ground traces 126 may be conductively coupled (e.g., shorted) to support plate 70 and thus conductive rear wall 54 (e.g., using conductive screws, solder, welds, conductive adhesive, etc.). Screws, brackets, clips, adhesive, or other fastening structures may also be used to help mechanically secure feed printed circuit 118 to conductive rear wall 54. Ground traces 122 may be coupled to the ground conductor for a coaxial cable or other transmission line for antenna 40. Ground traces 122, conductive vias 128, ground traces 126, support plate 70, and conductive rear wall 54 may thereby be held at a ground potential (e.g., to form ground antenna feed terminal 36 of FIGS. 1, 3, and 4 for antenna 40).

Signal traces such as signal traces 124 may also be patterned onto one or more dielectric layers 120 of feed printed circuit 118. Signal traces 124 may be coupled to the signal conductor for a coaxial cable or other transmission line for antenna 40. Dielectric layers 120 may include opening 130. Conductive structure 60 may also include an opening such as opening (cavity) 132. A conductive interconnect structure such as conductive screw 108 may be used to form the positive antenna feed terminal for antenna 40. Conductive screw 108 need not be a screw and may, if desired, include other conductive interconnect structures (e.g., conductive pins, conductive springs, conductive wire, conductive traces, and/or other conductive interconnect structures).

Conductive screw 108 may include a head portion 110 and a shaft portion 117. Head portion 110 may be electrically coupled to signal traces 124 (e.g., using solder, welds, conductive adhesive, etc.). Shaft portion 117 may extend from head portion 110, through opening 130 in feed printed circuit 118, through opening 58 in conductive rear wall 54, and through opening 132 in conductive structure 60 to hinge barrel 62. Tip 112 of shaft portion 117 may be electrically coupled and attached (e.g., fastened or secured) to the portion of conductive tongue 68 located to the left of slot element 102 (e.g., the portion of conductive tongue 68 located within hinge barrel 62). As an example, the portion of conductive tongue 68 within hinge barrel 62 may include a conductive screw boss or threaded recess. Tip 112 of screw 108 may be screwed into the conductive screw boss or threaded recess to secure screw 108 to the portion of conductive tongue 68 within hinge barrel 62.

Signal traces 124, screw 108, and the portion of conductive tongue 68 to the left of slot element 102 may be at a signal potential (e.g., to form positive antenna feed terminal 34 of FIGS. 1, 3, and 4 for antenna 40). In other words, signal traces 124 and screw 108 may form part of the signal conductor for the transmission line path for antenna 40 (e.g., signal conductor 28 of transmission line path 26 of FIG. 1). Shaft portion 117 of conductive screw 108 may have a diameter (width) 116. Diameter 116 may be less than the diameter of opening 132 to prevent shaft portion 117 from shorting to the portion of conductive tongue to the right of slot element 102, which is held at a ground potential. Tip 112 of shaft portion 117 may have a diameter (width) 114 that is different than (e.g., greater than) diameter 116. The difference between diameters 114 and 116 may be selected to match the impedance of antenna 40 to the impedance of the transmission line path for antenna 40 (e.g., to provide a 50 Ohm impedance match). This may configure antenna currents to flow around the perimeter of slot element 102 (e.g., within the X-Y plane of FIG. 5), producing corresponding radio-frequency signals 134 that are radiated with satisfactory antenna efficiency. Because slot element 102 extends through the thickness of conductive structure 60, radio-frequency signals 134 may be transmitted and received in both the +Z and −Z directions.

Figure 6:
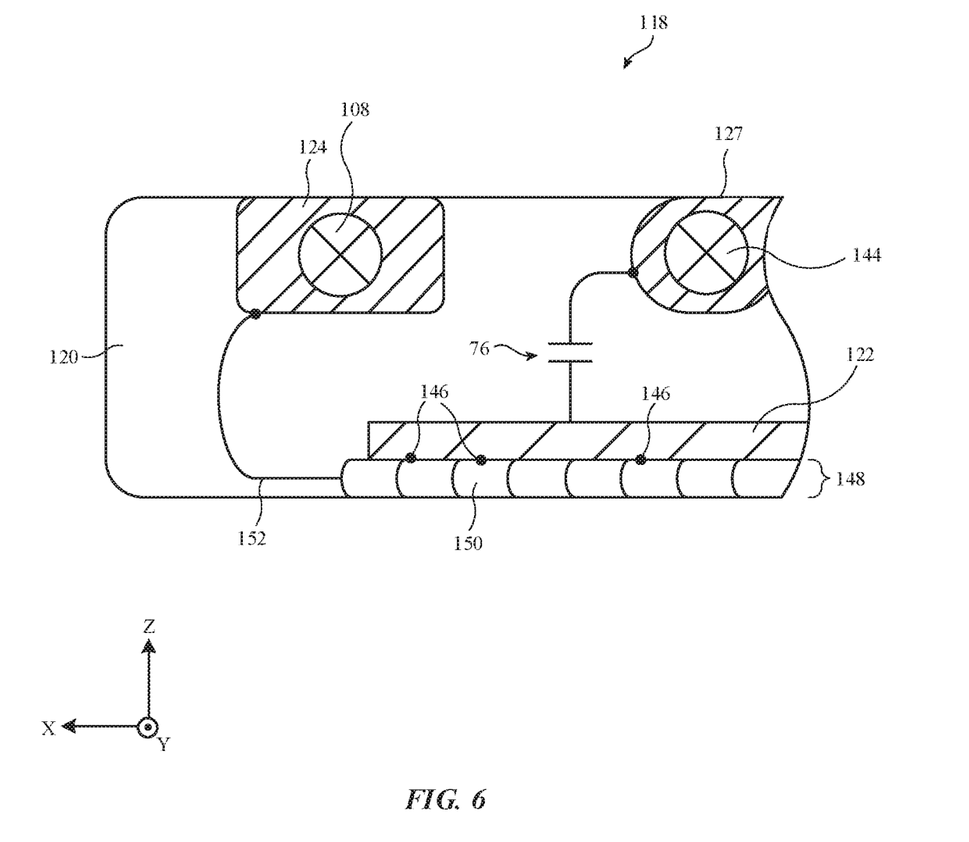
FIG. 6 is a front view of an illustrative flexible printed circuit that may be used to feed a slot antenna of the type shown in FIG. 5 in accordance with some embodiments.

FIG. 6 is a front view of feed printed circuit 118 (e.g., as taken in the direction of arrow 125 of FIG. 5). As shown in FIG. 6, ground traces 122, signal traces 124, and conductive traces 127 may be patterned on a given dielectric layer 120 of feed printed circuit 118. A transmission line such as coaxial cable 148 may be used to feed the antenna. Coaxial cable 148 may have a ground conductor 150 (e.g., an outer braid conductor) coupled to ground traces 122 by solder 146. Coaxial cable 148 may have a signal conductor 152 (e.g., an inner signal conductor) coupled to signal traces 124. Conductive screw 108 may extend through dielectric layers 120 and may be electrically coupled to signal traces 124. An additional screw such as conductive screw 144 may extend through dielectric layers 120 and may be electrically coupled to conductive traces 127. Conductive screw 144 may have a tip coupled to conductive tongue 68 within hinge barrel 62 (FIG. 5) at a different point along the length of the slot element 102 than conductive screw 108. Capacitor 76 may be coupled between conductive traces 127 and ground traces 122. Capacitor 76 may be, for example, a surface mount technology (SMT) capacitor mounted to dielectric layers 120. In this way, capacitor 76 may be electrically coupled across the slot element (e.g., slot element 102 of FIG. 5) for tuning multiple electromagnetic modes of the slot element (e.g., for covering multiple frequency bands) while also being located on feed printed circuit 118.

Figure 7:
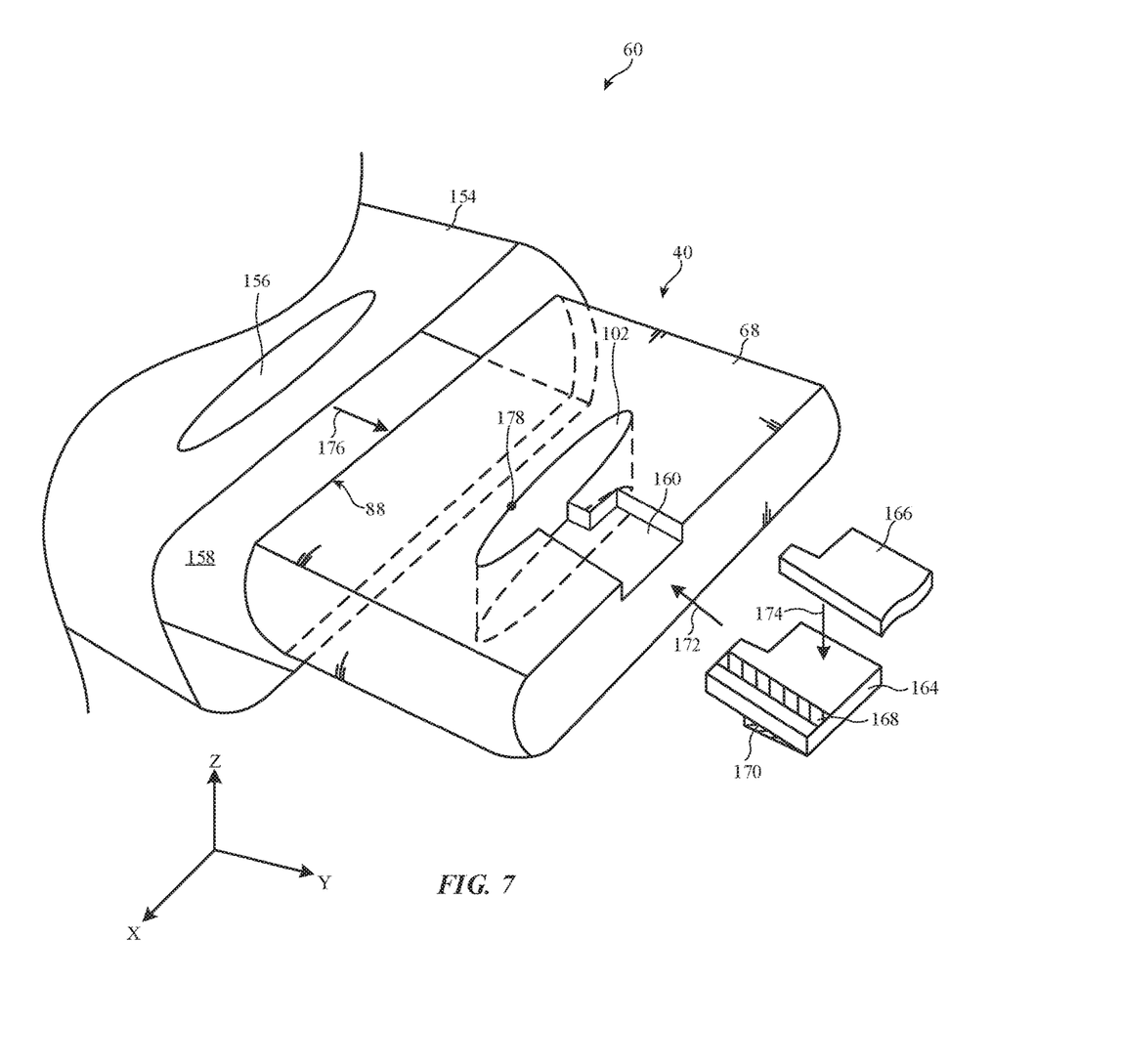
FIG. 7 is an exploded perspective view of an illustrative slot antenna formed in a conductive tongue that is inserted into a conductive sleeve in accordance with some embodiments.

If desired, conductive tongue 68 may be covered by a conductive sleeve and slot element 102 may be directly fed by a flexible printed circuit that bridges the slot element. FIG. 7 is an exploded perspective view showing how conductive tongue 68 may be covered by a conductive sleeve and how slot element 102 may be directly fed by a flexible printed circuit that bridges the slot element. In the example of FIG. 7, support plate 70 and main body portion 52 (FIG. 5) are not shown for the sake of clarity.

As shown in FIG. 7, conductive tongue 68 may include slot element 102. Slot element 102 is shown as a closed slot element (e.g., slot element 74 of FIG. 3) in the example of FIG. 7. This is merely illustrative and, if desired, conductive tongue 68 may include two antennas with open slot elements (e.g., antennas 40A and 40B having slot elements 94 of FIG. 4). Conductive tongue 68 may include a notch or recess such as notch 160 (e.g., at the upper or lower surface of conductive tongue 68).

Antenna 40 may be fed by a flexible printed circuit such as flexible printed circuit 164. Flexible printed circuit 164 may include ground traces 170 (e.g., forming part of ground conductor 30 of FIG. 1) and signal traces 168 (e.g., forming part of signal conductor 28 of FIG. 1). Flexible printed circuit 164 may be inserted into notch 160, as shown by arrow 172. Ground traces 170 may be shorted to conductive tongue 68 at the +Y side of slot element 102 (e.g., forming ground antenna feed terminal 36 of FIG. 1). A portion of flexible printed circuit 164 may extend across and bridge slot element 102. Signal traces 168 on flexible printed circuit 164 may be coupled to point 178 on the −Y side of slot element 102 (e.g., forming positive antenna feed terminal 34 of FIG. 1). While support plate 70 of conductive structures 60 is not shown in FIG. 7 for the sake of clarity, support plate 70 may be omitted or may otherwise include an opening to accommodate flexible printed circuit 164.

A dielectric cover layer such as dielectric liner 166 may be placed on top of signal traces 168 and flexible printed circuit 164, as shown by arrow 174. A conductive sleeve such as conductive sleeve 154 may be provided with a cavity such as cavity 158. Conductive sleeve 154 may be placed over conductive tongue 68, as shown by arrow 176 (e.g., the assembled conductive tongue 68, flexible printed circuit 164, and dielectric liner 166 may be inserted into cavity 158 of a conductive sleeve 154). Conductive sleeve 154 may be formed from metal such as aluminum, stainless steel, metal alloys, or other materials. When conductive tongue 68 is mounted within cavity 158, conductive sleeve 154 may hide flexible printed circuit 164 and slot element 102 from view and may protect flexible printed circuit 164 and slot element 102 from contaminants and damage.

Dielectric liner 166 may prevent signal traces 168 on flexible printed circuit 164 from shorting to conductive sleeve 154. Conductive sleeve 154 may have a dielectric antenna window such as dielectric window 156 on one or both sides of conductive sleeve 154. Dielectric window 156 may allow slot element 102 to radiate to the exterior of conductive sleeve 154 despite the presence of conductive sleeve 154. If desired, there may be a gap that separates conductive tongue 68 from conductive sleeve 154, dielectric liner 166 may cover additional portions of conductive tongue 68, and/or other dielectric spacers may be used to separate conductive tongue 68 from conductive sleeve 154. Flexible printed circuit 164 may be coupled to feed printed circuit 118 of FIG. 5 or may be coupled to a coaxial cable or other transmission line for antenna 40 (e.g., feed printed circuit 118 of FIG. 5 may be omitted).

Figure 8:
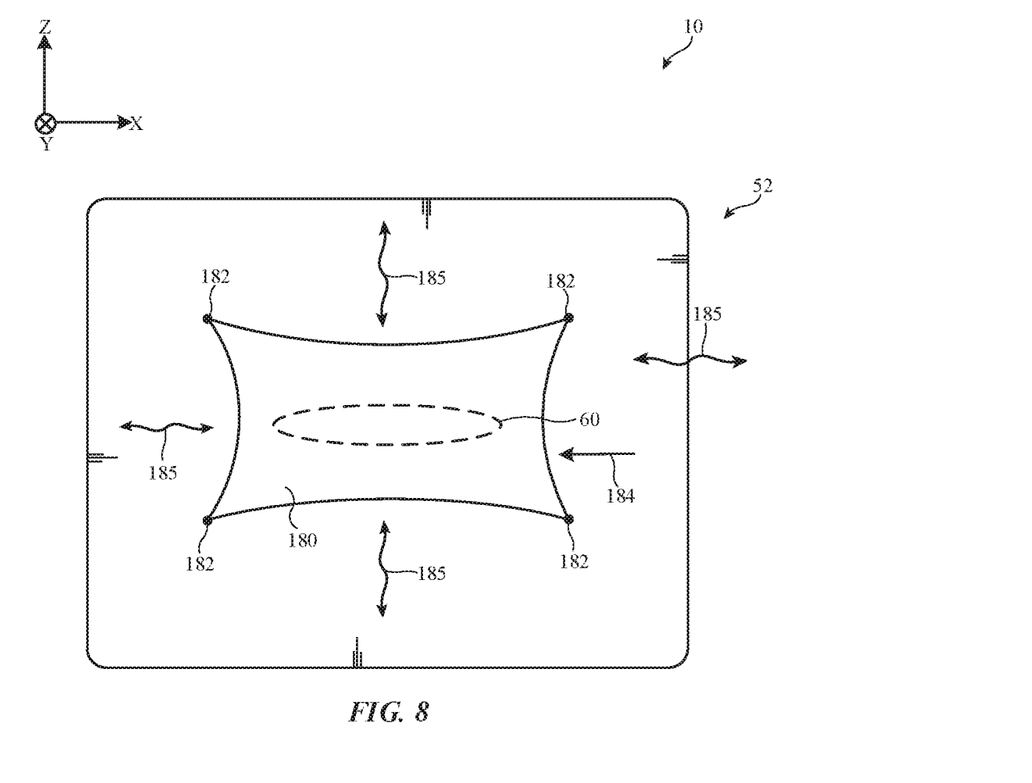
FIG. 8 is a rear view of an illustrative electronic device having a slot antenna located in a cavity between an electronic device housing and a mounting bracket in accordance with some embodiments.

In the examples of FIGS. 2-7, main body portion 52 of device 10 is mounted to stand 42. This is merely illustrative. In another suitable arrangement, main body portion 52 may be mounted to a wall-mount or stand (e.g., a flat display mounting interface (FDMI) wall-mount or stand) using a mounting bracket. FIG. 8 is a rear view of device 10 having a mounting bracket.

As shown in FIG. 8, device 10 may include a mounting bracket such as mounting bracket 180. Mounting bracket 180 may be coupled to conductive rear wall 54 by one or more support legs 182. Mounting bracket 180 may be formed from conductive material such as metal if desired. Mounting bracket 180 may be received by a bracket mounting structure on a stand or wall-mount. As an example, mounting bracket 180 may be received by and secured to an FDMI-compliant bracket mounting structure on a stand or wall-mount. The FDMI-compliant bracket mounting structure may be a Video Electronics Standards Association (VESA) Mounting Interface Standard (MIS) bracket mounting structure (e.g., a VESA mount), for example.

Mounting bracket 180 may be separated from conductive rear wall 54 by a cavity (e.g., support legs 182 may separate mounting bracket 180 from conductive rear wall 54 by a non-zero distance). Conductive structure 60 may be located within the cavity between mounting bracket 180 and conductive rear wall 54. The antenna(s) in conductive structure 60 may transmit radio-frequency signals 185 out of the cavity between mounting bracket 180 and conductive rear wall 54 (e.g., omnidirectionally within the X-Z plane).

Figure 9:
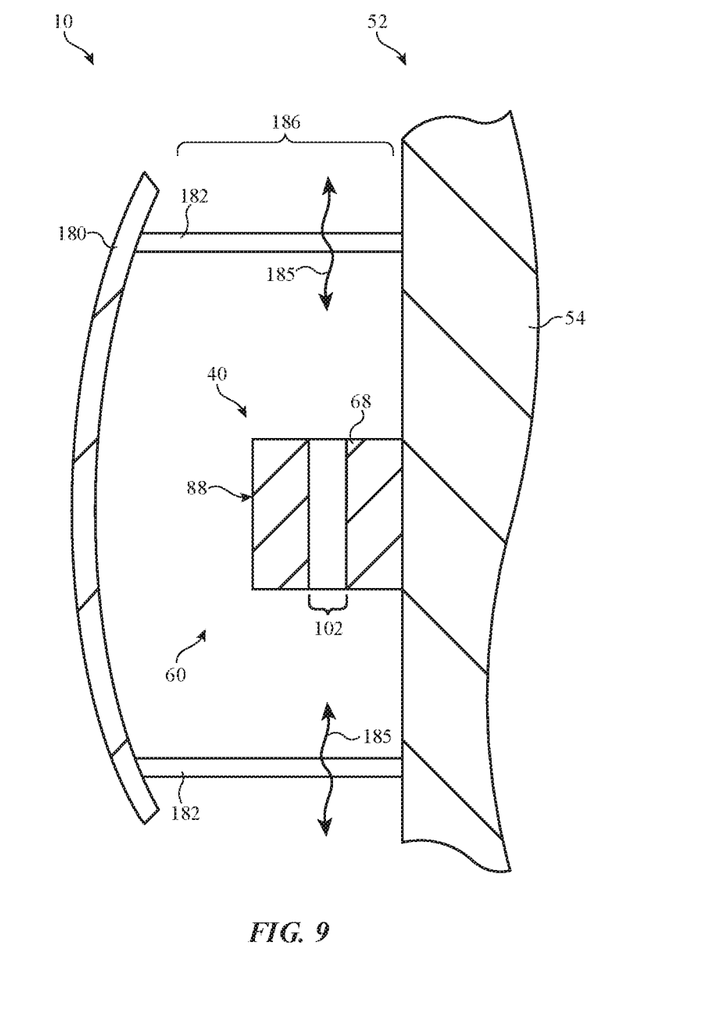
FIG. 9 is a side view of an illustrative electronic device having a slot antenna located in a cavity between an electronic device housing and a mounting bracket in accordance with some embodiments.

FIG. 9 is a side view of device 10 having mounting bracket 180 (e.g., as taken in the direction of arrow 184 of FIG. 8). As shown in FIG. 9, mounting bracket 180 may be affixed to conductive rear wall 54 by support legs 182. Mounting bracket 180 may be separated from conductive rear wall 54 by cavity 186. Conductive structure 60 (e.g., conductive tongue 68) may extend from rear conductive wall 54 into cavity 186 (e.g., with end 88 facing mounting bracket 180). Conductive tongue 68 may be covered by a conductive sleeve such as conductive sleeve 154 of FIG. 7 if desired. Slot element 102 for antenna 40 may radiate radio-frequency signals 185 out of cavity 186. If desired, mounting bracket 180 and support legs 182 may be removable. In this scenario, main body portion 52 may then be mounted to a different stand such as stand 42 of FIGS. 2 and 5 (e.g., stand 42 of FIGS. 2 and 5 may be removable from conductive structure 60 if desired).

The foregoing is merely illustrative and various modifications can be made to the described embodiments. The foregoing embodiments may be implemented individually or in any combination.

What is claimed is:

1. An electronic device configured to be mounted to a stand having a hinge barrel, the electronic device comprising:
a housing having a conductive housing wall, wherein the conductive housing wall comprises an opening;
a display mounted to the housing opposite the conductive housing wall;
a conductive structure that protrudes through the opening, wherein the conductive structure has a first end within the housing and an opposing second end that is configured to be coupled to the hinge barrel of the stand; and
an antenna in the conductive structure.

2. The electronic device of claim 1, wherein the antenna comprises a slot antenna having a radiating slot element in the conductive structure.

3. The electronic device of claim 2, further comprising:
an additional slot antenna having an additional radiating slot element in the conductive structure.

4. The electronic device of claim 3, wherein the conductive structure has opposing first and second edges that extend in parallel from the first end to the second end, the radiating slot element has an open end at the first edge, and the additional radiating slot element has an open end at the second edge.

5. The electronic device of claim 2, wherein the radiating slot element has a first electromagnetic mode configured to radiate in a first frequency band and a second electromagnetic mode configured to radiate in a second frequency band that is higher than the first frequency band.

6. The electronic device of claim 5, wherein the first frequency band comprises a 2.4 GHz wireless local area network (WLAN) band and the second frequency band comprises a 5 GHz WLAN band.

7. The electronic device of claim 5, further comprising:
a capacitor coupled across the radiating slot element, wherein the capacitor is configured to tune both the first and second electromagnetic modes.

8. The electronic device of claim 2, further comprising:
a conductive sleeve having a cavity, the conductive structure being mounted within the cavity, and the conductive sleeve having a dielectric antenna window aligned with the radiating slot element.

9. The electronic device of claim 2, wherein the conductive structure comprises:
a support plate at the first end and coupled to an interior surface of the conductive housing wall; and
a conductive tongue that extends from the support plate to the second end, wherein the conductive tongue protrudes through the opening, the slot radiating element being located in the conductive tongue.

10. The electronic device of claim 9, wherein the conductive tongue has a first surface, the conductive tongue has a second surface opposite the first surface, and the slot element extends from the first surface to the second surface.

11. The electronic device of claim 10, further comprising a first dielectric cover layer on the first surface and a second dielectric cover layer on the second surface.

12. The electronic device of claim 9, wherein the conductive structure and the housing are rotatable with respect to the stand about a hinge axis when the second end of the conductive structure is coupled to the hinge barrel, the hinge axis extending through the conductive tongue.

13. The electronic device of claim 9, further comprising:
a printed circuit having ground traces and signal traces, wherein the ground traces are electrically coupled to the support plate;
a transmission line having a ground conductor coupled to the ground traces and having a signal conductor coupled to the signal traces; and
a conductive screw having a head portion coupled to the signal traces and having a tip coupled to the conductive tongue at a side of the radiating slot element opposite the conductive housing wall, wherein the conductive screw has a shaft portion that extends from the head portion, through an opening in the printed circuit, through the opening in the conductive housing wall, and through an opening in the conductive tongue to the side of the radiating slot element opposite the conductive housing wall.

14. Apparatus comprising:
a stand having a base portion configured to rest on a surface and having a neck portion extending from the base portion;
a hinge barrel on the neck portion of the stand;
a housing having a conductive housing wall with an opening;
a display mounted to the housing opposite the conductive housing wall;

a conductive tongue that protrudes through the opening in the conductive housing wall, wherein the conductive tongue is coupled to the hinge barrel, the conductive tongue and the housing being rotatable with respect to the stand about a hinge axis running through the hinge barrel; and a slot antenna having a slot element in the conductive tongue.

15. The apparatus of claim 14, further comprising:
a flexible printed circuit that bridges the slot element;
ground traces on the flexible printed circuit that are coupled to the conductive tongue at a first side of the slot element; and
signal traces on the flexible printed circuit that are coupled to the conductive tongue at a second side of the slot element, the ground traces and the signal traces being configured to feed radio-frequency signals for the slot antenna.

16. The apparatus of claim 14, further comprising:
a conductive sleeve having a cavity, wherein the conductive tongue is located within the cavity; and
a dielectric antenna window in the conductive sleeve and aligned with the slot element.

17. The apparatus of claim 16, further comprising:
a dielectric liner interposed between the flexible printed circuit and the conductive sleeve.

18. The apparatus of claim 17, further comprising:
a notch in the conductive tongue and configured to receive the flexible printed circuit.

19. An electronic device comprising:
a housing having a conductive housing wall that forms a first face of the electronic device, wherein the conductive housing wall comprises an opening;
a display mounted to the housing, wherein the display forms a second face of the electronic device opposite the conductive housing wall;
a mounting bracket coupled to the conductive housing wall, wherein the mounting bracket is separated from the conductive housing wall by a cavity;
a conductive structure having a support plate coupled to the conductive housing wall at an interior of the housing and having a conductive tongue, wherein the conductive tongue extends from the support plate and protrudes through the opening and into the cavity; and
a slot antenna having a slot element in the conductive tongue.

20. The electronic device of claim 19, wherein the mounting bracket comprises a flat display mounting interface (FDMI) compliant mounting bracket.

* * * * *

UNITED STATES PATENT AND TRADEMARK OFFICE
CERTIFICATE OF CORRECTION

PATENT NO. : 11,108,130 B1  
APPLICATION NO. : 16/800920  
DATED : August 31, 2021  
INVENTOR(S) : Paul X. Wang et al.

Page 1 of 1

It is certified that error appears in the above-identified patent and that said Letters Patent is hereby corrected as shown below:

In the Claims

Column 17, Line 24, "between the flexible" should read -- between a flexible --

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*